United States Patent
Udagawa

Patent Number: 6,110,757
Date of Patent: Aug. 29, 2000

[54] METHOD OF FORMING EPITAXIAL WAFER FOR LIGHT-EMITTING DEVICE INCLUDING AN ACTIVE LAYER HAVING A TWO-PHASE STRUCTURE

[75] Inventor: Takashi Udagawa, Chichibu, Japan

[73] Assignee: Showa Denko K. K., Tokyo, Japan

[21] Appl. No.: 09/170,265

[22] Filed: Oct. 13, 1998

Related U.S. Application Data

[62] Division of application No. 08/906,935, Aug. 6, 1997, Pat. No. 5,886,367.

[30] Foreign Application Priority Data

Aug. 7, 1996 [JP] Japan .................................. 8-208486

[51] Int. Cl.[7] .................................................. H01L 21/00
[52] U.S. Cl. .......................... 438/47; 438/37; 438/483
[58] Field of Search ............................. 438/47, 37, 22, 438/483; 117/3

[56] References Cited

U.S. PATENT DOCUMENTS

| | | | |
|---|---|---|---|
| 4,012,242 | 3/1977 | Matare | 148/172 |
| 5,103,284 | 4/1992 | Ovshinsky et al. | 257/64 |
| 5,455,431 | 10/1995 | Manabe et al. | 257/63 |
| 5,714,004 | 2/1998 | Okuno | 117/3 |

FOREIGN PATENT DOCUMENTS

| | | |
|---|---|---|
| 0 496 030 A2 | 7/1992 | European Pat. Off. |
| 0 599 224 A1 | 6/1994 | European Pat. Off. |
| 195 11 415 A1 | 10/1995 | Germany |
| 55-3834 | 1/1980 | Japan |
| 4-192585 | 7/1992 | Japan |
| 4-236477 | 8/1992 | Japan |
| 6-209122 | 7/1994 | Japan |
| 2 310 083 | of 0000 | United Kingdom |

OTHER PUBLICATIONS

"Photoluminescence of InGaN films grown at high temperature by metalorganic vapor phase epitaxy", N. Yoshimoto et al., NTT Opto–Electronics Lab, 162 Tokai, Ibaraki 319–11, Japan; Applied Phy Lett vol. 59, No. 18, Oct. 28, 1991, pp 2251–2253.

"Candela–class high–brightness InGaN/AIGaN double–heterostructure blue–light–emitting diodes", Shuji Nakamura et al., Appl. Phys. Lett vol. 64 No. 13, Mar. 28, 1994, American Institute of Physics 1994, pp 1687–1689.

"High–brightness InGaN/AIGaN double–heterstructure blue–green–light–emitting diodes", Shuji Nakamura et al., Appl. Phys. Lett vol. 76, No. 12, Dec. 15, 1994, American Institute of Physics 1994, pp 8189–8191.

"High–brightness InGaN/AIGaN Blue, Green and Yellow Light–Emitting Diodes With Quantum Well Structures", Shuji Nakamura et al., Jpn. J. Appl. Phys. vol. 34, (1995) Pt 2, No. 7A, Jul. 1995, pp L797–L799.

S. Nakamura et al., Jpn. J. Appl. Phys. vol. 34 (1995) Pt. 2, No. 10B, pp. L1333–L1335.

Shuji Nakamura; J. Vac. Sci. Technol. A, vol. 13, No. 3, May/Jun. 1995; pp. 705–710.

*Primary Examiner*—Richard Elms
*Assistant Examiner*—Adam Pyonin
*Attorney, Agent, or Firm*—Armstrong, Westerman, Hattori, McLeland & Naughton

[57] ABSTRACT

A method of forming an epitaxial wafer for a light-emitting device by sequentially growing a lower cladding layer of $Al_\alpha Ga_\beta N$ ($0 \leq \alpha$, $\beta \leq 1$, $\alpha+\beta=1$), an AlGaInN active layer, and an upper cladding layer of $Al_\alpha Ga_\beta N$ ($0 \leq \alpha$, $\beta \leq 1$, $\alpha+\beta=1$) on a single-crystal substrate, wherein the AlGaInN active layer is formed by epitaxially growing an active layer of $Al_a Ga_b In_c N$ (wherein $0 \leq a$, b, $c \leq 1$, $a+b+c=1$) on the lower cladding layer at a temperature of from 650° C. to 950° C., elevating the temperature of the active layer at a rate of not less than 30° C./min until reaching a temperature range of from more than 950° C. to not more than 1200° C., and when the prescribed temperature is reached, primarily cooling the resultant layer to 950° C. within 60 minutes at not less than 20° C./min, and secondarily cooling the resultant layer from 950° C. to 650° C. at less than 20° C./min.

1 Claim, 3 Drawing Sheets

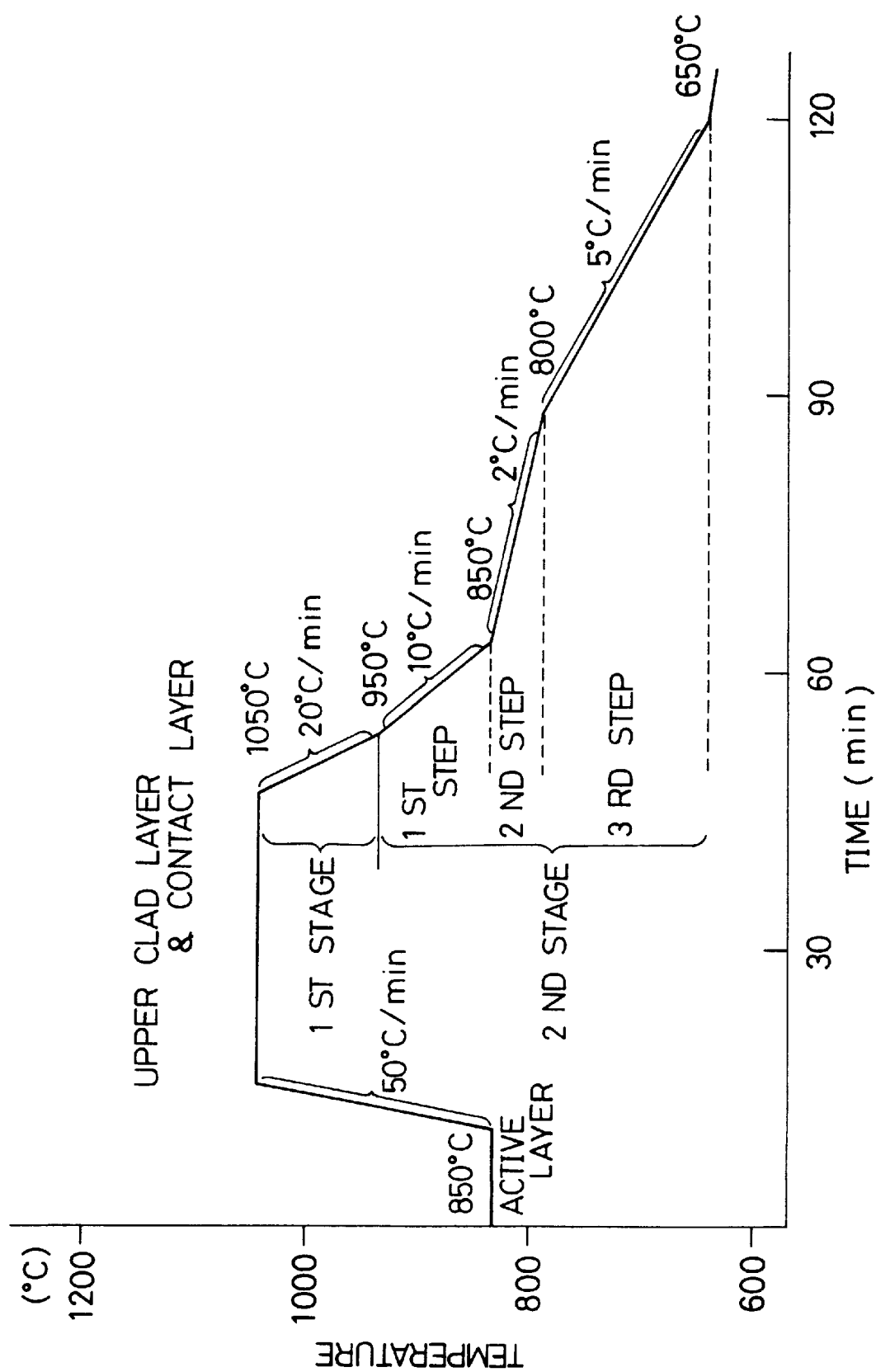

METHOD OF FORMING EPITAXIAL WAFER FOR LIGHT-EMITTING DEVICE INCLUDING AN ACTIVE LAYER HAVING A TWO-PHASE STRUCTURE

This application is a division of prior application Ser. No. 08/906,935, filed Aug. 6, 1997, now U.S. Pat. No. 5,886,367.

BACKGROUND OF THE INVENTION

1. Field of the Invention

This invention relates to an epitaxial wafer for a short-wavelength light-emitting device such as a blue or green visible light-emitting device and to a light-emitting device using the wafer.

2. Description of the Prior Art

Group II–VI compounds such as zinc selenide (ZnSe) are already known as the wide-band gap semiconductors which can radiate blue and green light. Visible short-wavelength light is also known to be emitted from III–V compound semiconductors, such as gallium phosphide (GaP) and aluminum gallium indium phosphide (AlGaInP) mixed-crystal. Recent optical device technology, however, employs group III nitride compound semiconductors such as aluminum gallium indium nitride mixed-crystal generally represented by the formula $Al_xGa_yIn_zN$ (x+y+z=1, $0 \leq x$, y, $z \leq 1$) (J. Appl. Phys., 76 (12) (1994), pp 8189–8191). Group III nitride semiconductors which include a group V element such as arsenic or phosphorus in addition to nitrogen are also coming into use (JP-A-HEI 4-192585 and JP-A-HEI 4-236477). In particular, gallium indium nitride mixed-crystal ($Ga_yIn_zN$) is attracting attention as a material for constituting an active layer that emits blue or green light (JP-B-SHO 55-3834). The gallium indium nitride mixed-crystal ($Ga_yIn_zN$) has been actually used as active layer for blue (450 nm) and green (525 nm) LED (Jpn. J. Appl. Phys., 34 (Part 2 No. 7A) (1995), pp L797–L799).

In general, the emission portion of these light-emitting devices normally have a double hetero-structure (Appl. Phys. Lett., 64 (13) (1994), pp 1687–1689). FIG. 1 is a cross-sectional view of a conventional blue LED equipped with an emission portion comprised of a pn junction type double hetero-structure (J. Vac. Sci. Technol., A, 13 (3) (1995), pp 705–710). The LED is constructed from a sapphire ($\alpha$-$Al_2O_3$ single-crystal) substrate 101 with a (0001) orientation (c face), a low-temperature buffer layer 102 of gallium nitride (GaN), a silicon-doped n-type lower cladding layer 103 of aluminum gallium nitride mixed-crystal ($Al_{0.15}Ga_{0.85}N$), a silicon- and/or zinc-doped n-type active layer 104 of gallium indium nitride mixed-crystal ($Ga_{0.94}In_{0.06}N$), a magnesium-doped p-type upper cladding layer 105 of aluminum gallium nitride mixed-crystal ($Al_{0.15}Ga_{0.85}N$), and a magnesium-doped p-type contact layer 106 of gallium nitride. Reference numerals 110 and 111 denote electrodes. The LED has a double hetero-structure light-emission portion 107 comprised by the lower cladding layer 103, active layer 104 and upper cladding layer 105. A double hetero-structure is equipped to confine both of electrons and holes transferred from n-type cladding layer in the active layer.

To get blue emission, it has been necessary to raise the indium composition in the mixed-crystal to 0.20. Similarly to this, more larger indium composition about 0.45 has been required to get green light emission. The metal-organic chemical vapor deposition (MO-CVD) method has the advantage of the controllability of composition. Many difficulties, however, are involved to form gallium indium nitride with a high indium composition. For example, gallium indium nitride with a high indium composition requires the growth at a lower growth temperature (Appl. Phys. Lett., 59 (1991), pp 2251–2253). The MO-CVD growth of $Ga_{0.55}In_{0.45}N$, for instance, has been done around 500° C. On the other hand, it is known that MO-CVD growth at a lower temperature in the order of 500° C. results in gallium indium nitride with a degraded crystallinity. In the MO-CVD growth of gallium indium nitride at a lower temperature, droplets of indium or gallium are produced due to the difference in the thermal composition efficiency between group III and V source materials. The droplets are not always distributed homogeneously, resulting in poor surface morphology. A gallium indium nitride mixed-crystal grown at a low temperature can therefore not generate high-intensity luminescence because of poor crystallinity and surface morphology.

It is reported that gallium indium nitride epitaxial layer with excellent crystallinity is obtained only under the limited growth temperature and growth rate (JP-A-HEI 6-209122). Furthermore, the following technical problems prevent the growth of homogeneous gallium indium nitride epitaxial layer.

(i) Owing to an intense immiscibility of GaN and InN, phase separation is readily caused by heating during GaInN epitaxial growth or thereafter, (ii) Owing to characteristic tendency of indium to diffuse and condense into crystalline defects and stressed region, epitaxial growth conditions for GaInN with excellent crystallinity are limited to an extremely narrow range.

Due to the difficulties to obtain gallium indium nitride having excellent crystallinity applicable enough to the active layer, conventional light-emitting devices cannot reproductively emit high-intense blue or green light enough to meet the needs of the market. A further problem is that emission wavelengths can vary depending on the voltage applied to the light-emitting device, producing secondary emission spectra that adversely affect emission monochromaticity. The full width at half minimum (FWHM) of the emission spectra of the main emission spectrum that indicates monochromaticity is improved if the thickness of the active layer is decreased. The decrease in thickness, however, lowers emission power with undesirable secondary spectra still remaining.

An object of the present invention is to form a double hetero-structure using an epitaxial layer of gallium indium nitride mixed-crystal having good crystallinity with a relatively low indium concentration to provide a blue or green short wavelength light-emitting device that exhibits good monochromaticity and high emission power and an epitaxial wafer for the light-emitting device.

SUMMARY OF THE INVENTION

The present invention attains the above objects by providing an epitaxial wafer for a short-wavelength light-emitting device comprising a lower cladding layer of $Al_\alpha Ga_\beta N$ ($0 \leq \alpha$, $\beta \leq 1$, $\alpha+\beta=1$), an AlGaInN active layer, and an upper cladding layer of $Al_\alpha Ga_\beta N$ ($0 \leq \alpha$, $\beta \leq 1$, $\alpha+\beta=1$) formed sequentially on a single-crystal substrate, wherein the active layer is a two-phase structure comprised of a matrix of $Al_xGa_yIn_zN$ (wherein $0 \leq x$, y, $z \leq 1$, x+y+z=1) and crystallets of $Al_aGa_bIn_cN$ (wherein $0 \leq a$, b<1, 0<c<1, and a+b+c=1).

A short-wavelength light-emitting device according to the present invention also has an electrode of a first conductivity type provided on the lower cladding layer and an electrode of a second conductivity type provided on the upper cladding layer via a contact layer on an upper surface of the upper cladding layer.

It is considered that the reason why an active layer having a two-phase structure contributes to improving the emission power is that the matrix covers the crystallets, creating a homogeneous strain field around the crystallets under which the crystallets can act as quantum dots. Moreover, by restricting a density of the crystallets in the active layer within the range $1 \times 10^{12}$ cm$^{-3}$ to $2 \times 10^{18}$ cm$^{-3}$, high emission intensity and monochromaticity can be ensured even for a thinner active layer.

A preferred method of forming the matrix and crystallets that constitute the two-phase structure of the active layer according to the present invention comprises epitaxially growing an active layer on the lower cladding layer at a temperature of from 650 to 950° C., heating the resultant layer at a rate of not less than 30° C./min until the active layer reaches a temperature ranging from 950 to 1200° C., and after the active layer has reached the prescribed temperature, primarily cooling the resultant layer at a rate of 20° C./min until the active layer reaches 950° C. within 60 minutes, and once the active layer reaches 950° C., secondarily cooling the resultant layer until the active layer reaches 650° C. at a rate of less than 20° C./min. This heating of the active layer to a temperature range of from 950 to 1200° C. produces the nuclei to initiate the growth of crystallets. The relatively rapid primary cooling to the vicinity of 950° C. results in the stable formation of crystallets around the nuclei, and the change to the relatively slow secondary cooling removes stresses generated by rapid cooling in the primary stage. Using this two-stage cooling process, an active layer having a two-phase textured structure of matrix and crystallets can be formed readily with good reproducibility. The size and density of the crystallets thus formed can be controlled by controlling the heating and cooling conditions and the like.

The above and other objects and features of the present invention will become apparent from the following description made with reference to the accompanying drawings.

BRIEF EXPLANATION OF THE DRAWINGS

FIG. 4 is an example of time-sequential diagram of the heating and cooling treatment for an epitaxial wafer according to this invention.

DESCRIPTION OF THE PREFERRED EMBODIMENT

Figure 1:
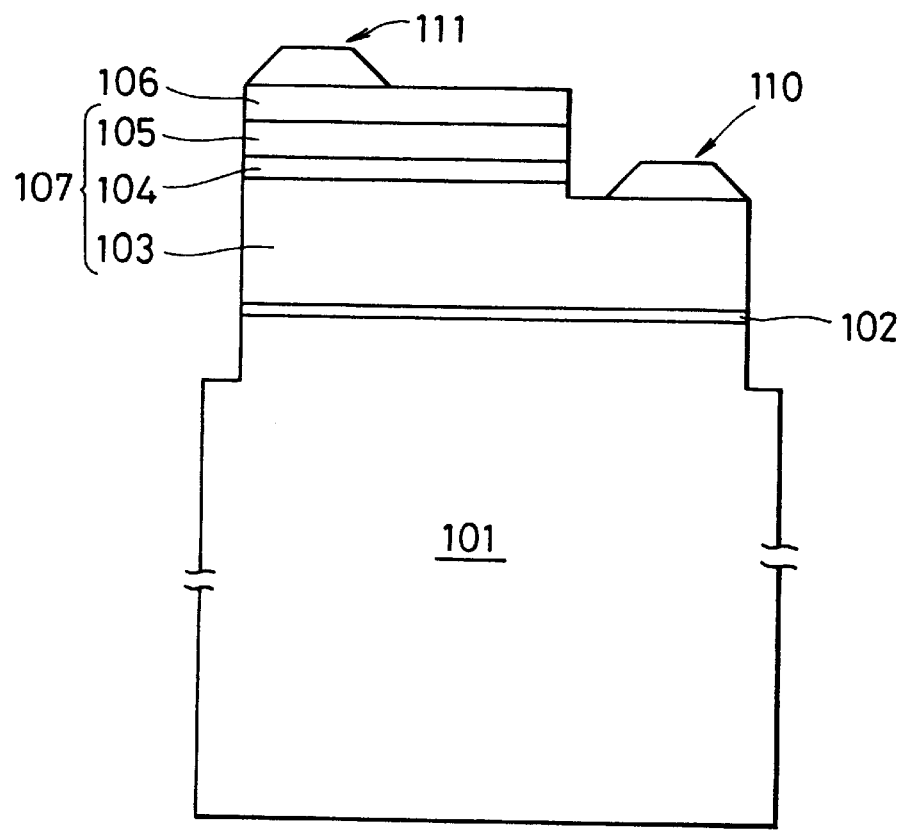
FIG. 1 is a cross-sectional view of the structure of a conventional GaInN blue light-emitting device.
Figure 2:
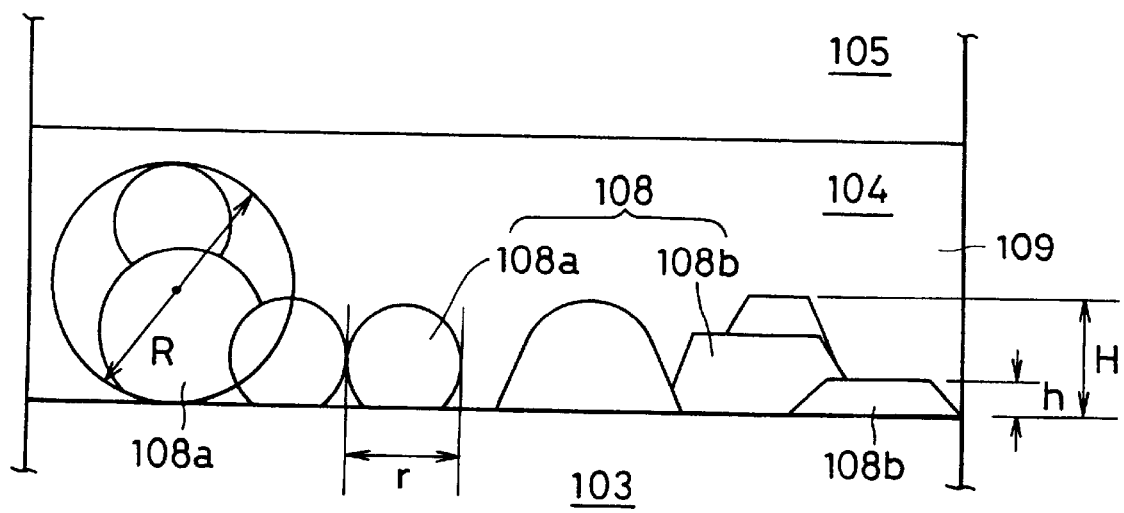
FIG. 2 is an enlarged cross-sectional view of the structure of an active layer of a light-emitting device according to the present invention.

The epitaxial wafer for a light-emitting device according to the present invention has the same basic structure as that of the conventional blue light-emitting device shown in FIG. 1. Namely, a light-emission portion 107 having an AlGaN-based double hetero-structure is epitaxially grown on a GaN buffer layer 102 formed on a sapphire substrate 101, said light-emission portion 107 comprising an active layer 104 between a lower cladding layer 103 and an upper cladding layer 105. As shown in FIG. 2, the active layer 104 has a two-phase structure, comprised by a matrix 109 of $Al_xGa_yIn_zN$ (wherein $0 \leq x$, y, $z \leq 1$, x+y+z=1) and crystallets 108 of $Al_aGa_bIn_cN$ (wherein $0 \leq a$, b<1, 0<c<1, and a+b+c=1).

For the upper and lower cladding layers (105 and 103), a semiconducting material having a bandgap energy that is greater than that of the active layer is selected so as to form a potential barrier to carriers injected into the active layer 104. In spite of the fact that both lower and upper cladding layers may be permitted to be constituted of the same semiconductor, it is desirable and usual for the upper cladding layer to be constructed of a larger bandgap than the lower cladding layer. The upper and lower cladding layers are formed of a GaN or aluminum gallium nitride based compound semiconductor denoted by the formula $Al_xGa_yN$. A compound semiconductor of $Al_xGa_yN_aP_{1-a}$ ($0<a \leq 1$) or $Al_xGa_yN_bAs_{1-b}$ ($0<b \leq 1$) which includes a group V element such as phosphorus or arsenic may also be utilized. The upper and lower cladding layers are given mutually opposite electric conduction types. It is desirable for the lower cladding layer to have a thickness of about 1.5 to 6.0 µm and the upper cladding layer to have a thickness of around 0.02 to 0.5 µm.

The active layer of the present invention is comprised of aluminum gallium indium nitride based crystal having indium as an essential component, represented by the formula $Al_aGa_bIn_cN$ (wherein $0 \leq a$, b<1, 0<c<1, and a+b+c=1). Indium is an essential component but aluminum and gallium are not always. Concerning a desirable composition of Al and Ga for a light-emitting device emitting blue to green light with a wavelength ranging from 430 nm to 550 nm, based on bandgap factors, the Al composition a should be no more than 0.10 based on bandgap energy. Aluminum composition preferably should be no more than 0.05. Aluminum composition a is permitted to be zero. Gallium composition b is preferably within the range 0.80 to 0.98.

The reason for making the active layer containing a mixture of gallium nitride and indium nitride is that it facilitates adjusting the bandgap to one suitable to radiate short-wavelength emission. In accordance with this invention, indium composition c in the active layer is preferably not less than 5% and not more than 15% for stable and reproducible active layer formation. This lower indium composition makes it possible to get high crystalline quality active layer even at a high temperature growth. For example, $Ga_{0.98}In_{0.02}N$, $Ga_{0.94}In_{0.06}N$, and $Ga_{0.85}In_{0.15}N$ are preferred mixed crystals for active layer. Examples of aluminum containing mixed-crystal favored for the active layer are $Al_{0.05}Ga_{0.88}In_{0.07}N$ and $Al_{0.05}Ga_{0.85}In_{0.10}N$ and the like.

The characteristic feature of the present invention is that the active layer 104 is a two-phase structure comprised of a matrix 109 of $Al_xGa_yIn_zN$ (wherein $0 \leq x$, y, $z \leq 1$, x+y+z=1) and indium-containing crystallets 108 of $Al_aGa_bIn_cN$ (wherein $0 \leq a$, b<1, 0<c<1, and a+b+c=1). The matrix contains spherical crystallets 108a and mesa-shaped crystallets 108b having different indium compositions from the matrix phase.

From 1 to 300 nm is a suitable thickness for the active layer. An active layer too thin will weaken the emission intensity. On the other hand, an active layer thicker than 300 nm will lack excellent surface morphology. For an undoped active layer, thickness is desirable to keep within 20 nm. For an impurity-doped active layer, thickness over 20 nm is preferred. The matrix 109 is formed of $Al_xGa_yIn_zN$ having an average composition close to that of the active layer 104. The indium composition of the matrix phase is close to that of the active layer. The amount of indium in the matrix phase is reduced often through vaporization, and sometimes becomes nearly to zero.

The crystallets 108 are formed of $Al_aGa_bIn_cN$ (wherein $0<c<1$, and $a+b+c=1$). Crystallets are micro crystals of nitrides that contain indium as an essential component (namely, $0<c<1$) and at least Al or Ga as the other component (namely, $0 \leq a, b<1$). Crystallets tend to be generated at the region where In accumulates in high concentration. Most of all crystallets have a spherical shape. Mesa-shaped crystallets are also recognized to be formed depending on growth conditions. There is no particular limitation on the shape of crystallets. FIG. 2 depicts the inner structure of an active layer according to the invention. Most of the crystallets 108 are formed on the lower cladding layer 103. The crystallets 108 are examples of micro crystals with a substantially spherical shape 108a and a mesa shape 108b. The surface of the mesa-shaped crystallets is flat or sometimes rounded into a hemispherical shape. In FIG. 2, h denotes the height of mesa-shaped crystallets, and H is the height of a plurality of overlaid mesa-shaped crystallets. Also in the drawing, r indicates the diameter of spherical crystallets, and R is the collective diameter of a plurality of spherical crystallets.

The primary factor that determines the emission wavelength of the active layer 104 having this two-phase structure is indium composition c of the active layer. An indium composition c of around 0.02 to 0.08 is favorably used to produce blue-light emission having a wavelength in the vicinity of 450 nm, and an indium composition c of 0.10 to 0.20 is favorably used to produce green-light emission having a wavelength in the vicinity of 530 nm. Even when active layers have the same indium composition c, emission wavelength will be varied by changing the active layer thickness. Emission wavelength can also be changed by changing the aluminum composition of the upper cladding layer in contact with the active layer. The major factor affecting the monochromaticity and emission intensity is the density of the crystallets in the active layer. Emission intensity and monochromaticity are improved by confining the crystallet density to an appropriate range.

The reason why an active layer with a two-phase structure has an advantage to improve the emission power is considered that matrix phase provides a homogeneous strain field effective to quantize the crystallets as quantum dots. Ideally the crystallets should be surrounded homogeneously by the matrix phase. To achieve this means, the thickness of the matrix phase has to be greater than the height or diameter of the crystallets. A matrix having a thickness more than 20% greater than the diameter or height of the crystallets can cover the crystallets completely. On the active layer equipped in double hetero-structure, permissible thickness of the matrix phase should be determined in conjunction with the diffusion lengths of injected carriers. The thickness of an undoped active layer should be around 1 to 50 nm. For an impurity-doped active layer, the thickness should be around 50 to 100 nm. Preferred examples of active layer thickness, i.e., matrix phase thickness, is 15 nm for the crystallets of 8 nm in diameter, and is 50 nm for the crystallets of 12 nm in diameter. The thickness of the matrix phase can be adjusted by means of the epitaxial growth time. Crystallet diameter can be controlled by changing the epitaxial growth temperature and growth rate.

The close relation between crystallet density and photoluminescence intensity will now be described taking the active layer for blue-light emission as an example. When crystallet density exceeds $2 \times 10^{18}$ $cm^{-3}$, the FWHM of principle spectrum is broad owing to the appearance of undesirable secondary spectra around at 450 nm. The active layer with crystallet density less than $1 \times 10^{12}$ $cm^{-3}$ gives no secondary spectra, but brings about a decrease in the emission intensity of the principle spectrum with a large FWHM. A crystallet density that is not less than $1 \times 10^{12}$ $cm^{-3}$ and not more than $2 \times 10^{18}$ $cm^{-3}$ results in a desirable emission spectrum with a narrow FWHM less than 15 nm.

When the crystallet density exceeds $2 \times 10^{18}$ $cm^{-3}$ a steep lowering in emission intensity is given to the principle spectrum at 450 nm. If the crystallet density in the active layer is increased even more, a further attenuation in the emission intensity of the principle 450 nm spectrum is given. Contrary to this, the intensity of secondary spectra increases. In the present invention, therefore, the density of crystallets in the active layer is limited to not less than $1 \times 10^{12}$ $cm^{-3}$ and not more than $2 \times 10^{18}$ $cm^{-3}$ in order to maintain emission intensity and ensure emission monochromaticity. The density is more preferably to be not less $1 \times 10^{15}$ $cm^{-3}$ and not more than $1 \times 10^{18}$ $cm^{-3}$. The effect of crystallet density is particularly pronounced in the case of an active layer doped with silicon or zinc or the like over 20 nm in thickness.

With especial respect to an undoped active layer less than 20 nm in thickness, the preferred crystallet density a (unit: crystallets/$cm^3$) for an active layer thickness t (unit: cm) is given based on experiments by the following equation (1).

$$d(\text{crystallets/cm}^3) \leq 5.0 \times 10^{23} \times t \qquad (1)$$

This equation was established for an undoped gallium indium nitride active layer having an indium mixing ratio of 10% or less. The experiments are directed at finding the layer thickness that would provide high emission intensity and FWHM less than 15 nm. An active layer having such a crystallet density is formed by selecting the growth temperature and growth rate. Preferred growth temperature is from about 650° C. to about 950° C., and more preferably from 800° C. to 850° C. Preferred growth rate is from about 1 nm/min to about 5 nm/min.

The crystallets can also be formed by heat treatment under specific conditions after the epitaxial growth of the active layer. More specifically, this method includes epitaxial growth of an AlGaInN active layer at from 650° C. to 950° C. (T° C.), followed by a heating process in which the layer is heated from T° C. to a high temperature (T'° C.) of not less than 950° C. and not more than 1200° C. at a rate of not less than 30° C./min, a primary cooling process in which the layer is cooled from T'° C. to 950° C. at a rate not less than 20° C./min keeping a staying period between 950° C. and T'° C. within 60 minutes, and a secondary cooling process in which the layer is cooled from 950° C. to 650° C. at a rate less than 20° C./min. The reason for defining the growth temperature (T° C.) of the active layer over 650° C. to not more than 950° C. is that this temperature range enables gallium indium nitride with excellent crystallinity to be obtained.

In accordance with this invention, the active layer is heated from T° C. to the high temperature T'° C. at a rate of 30° C./min or more, for example 50° C./min. A slower rate provides opportunity for indium atoms to diffuse and accumulate at dislocations and other crystalline defects. The heat treatment from T° C. to a higher temperature generates nuclei of crystallets. A lower heating rate is not desirable since it provides a longer staying at high temperatures, and therefore enhances the formation of droplets by thermally diffused indium. Heat treatment over 1200° C. is not desirable since it enhances sublimation of the indium resulting in poor surface morphology. In accordance with this invention, the range of the heat treatment temperature $T^{\circ}$ C. for producing crystalline texture in the active layer is defined as from over 950° C. to not over 1200° C. To prevent serious vaporization loss of indium during the staying at a high temperature of 950° C. or more, it is desirable to keep the period to be not longer than 60 minutes. The heat treatment of this invention can be substituted by heating process to grow epitaxial layers such as upper cladding layer and contact layer on the active layer. In the substitutional heat treatment, staying period including the time required to deposit the upper cladding layer and contact layer should be within 60 min.

After completion of the heat treatment process, the active layer is cooled. In accordance with this invention, the active layer treated at a high temperature is cooled in two stages. The step of cooling from the high temperature to 950° C. is the primary cooling process. The primary cooling process is provided to stabilize the texture produced by the heat treatment process. The reason for the somewhat high cooling rate used in this primary cooling process is that a slow cooling promotes structural changes in the texture. In the primary cooling process, cooling means such as an air blowing into MO-CVD reactor or the like is effectively used to get a cooling rate of at least 20° C./min. Preferred cooling rate in primary step is 25° C./min to 30° C./min.

The step of cooling from 950° C. to 650° C. is the secondary cooling process. The present invention prescribes the relationship between the cooling rates of the primary and secondary cooling processes. The cooling rate used in the secondary cooling process is lower than that used in the primary cooling process. The main object of the secondary cooling process is to remove internal thermal strains imparted to the active layer by the relatively rapid cooling in the primary cooling process. The cooling rate used in the secondary cooling process is therefore less than 20° C./min. More preferred rate ranges from 10° C./min to 15° C./min, which is lower than the cooling rate used in the primary cooling process. The cooling rate only has to be controlled to 650° C., after which cooling with various rates may be allowed.

As described in the foregoing, the light-emitting device is fabricated by forming the active layer 104 comprised of matrix 109 and crystallets 108, on which upper cladding layer 105 and contact layer 106 are grown by a usual method, after which a p-type electrode 111 is provided on contact layer 106. On a region where the lower cladding layer 103 is removed to expose, an n-type electrode 110 is formed to thereby complete the light-emitting device.

In accordance with the present invention only a simple method can be used to obtain a light-emitting device that emits blue or green light with high emission power and good monochromaticity as described above.

Examples of the present invention will now be described. However, the present invention is not limited to the examples.

EXAMPLE 1

The example of a blue light-emitting device with a gallium indium nitride active layer formed by atmospheric pressure MO-CVD is described. The basic layered structure of the device is the same as that of the light-emitting device shown in FIG. 1.

First, the temperature of the substrate 101 was raised from room temperature to 1150° C. and the substrate was subjected to thermal etching at that temperature for 40 minutes. The temperature of the substrate 101 was then lowered to 420° C. and maintained for 25 minutes until the temperature stabilized. During the stabilization, the flow rate of hydrogen gas to the reaction furnace was adjusted to 8 liters per minute. The furnace was then supplied with ammonia gas ($NH_3$) as a source of nitrogen, at a flow rate of 1 liter per minute, to get a growth atmosphere containing nitrogen source in MO-CVD reactor. Trimethyl gallium (($CH_3$)$_3$Ga) was added as the gallium source, at a flow rate of $2 \times 10^{-6}$ mol per minute. The V/III ratio thus becomes to be $2.2 \times 10^4$. The supply of trimethyl gallium was continued for 20 minutes, forming a 15-nm-thick low-temperature buffer layer 102 of gallium nitride (GaN).

The hydrogen gas was then replaced by argon gas. The argon gas flow rate was adjusted to 3 liters per minute. The flow rate of ammonia gas to 1 liter per minute, and the temperature of the substrate 101 was elevated to 1100° C. When the temperature of the substrate 101 reached to 1100° C., the supply of hydrogen gas to the reaction furnace was restarted at a flow rate of 3 liters per minute. At the same time, the flow rate of ammonia gas to the reaction furnace was increased to 6 liters per minute. When the temperature had stabilized, trimethyl gallium was added at the rate of 1.7 milliliters per minute. As the silicon doping gas, disilane gas ($Si_2H_6$) diluted with hydrogen to a concentration of 5 ppm by volume was used. The disilane gas was supplied at a flow rate of 10 milliliters per minute. Epitaxial growth proceeded for 90 minutes, producing an n-type gallium nitride lower cladding layer 103 having a thickness of 3.2 $\mu$m and a carrier concentration of $3 \times 10^{18}$ cm$^{-3}$.

Next, the temperature of the substrate 101 was reduced to 830° C. within about 10 minutes, the flow rate of ammonia gas was adjusted to 6 liters a minute, the flow of argon gas to 3 liters per minute. Trimethyl gallium was supplied at 0.27 milliliter per minute, and cyclopentadienyl indium ($C_5H_5In$) was supplied as the source of indium at 0.04 milliliter per minute. For the p-type dopant, diethyl zinc (($C_2H_5$)$_2$Zn) was supplied at the rate of 20 milliliters per minute. The diethyl zinc was diluted with hydrogen gas to a concentration by volume of 100 ppm. In 15 minutes, there was formed a gallium indium nitride ($Ga_{0.94}In_{0.06}N$) active layer 104 having an indium mixing ratio of 6% and a thickness of 60 nm.

After completion of the formation of the active layer 104, the temperature of the substrate 101 was again elevated to 1100° C. Also, the ammonia gas was supplied at 6 liters per minute and the argon gas was supplied at 3 liters per minute, trimethyl gallium was supplied at 1.36 milliliters per minute, and trimethyl aluminum (($CH_3$)$_3$Al), as the aluminum source, was supplied at 0.06 milliliter per minute. Bis-methylcyclopentadienyl magnesium (bis-(($CH_3C_5H_4$)$_2$Mg) was added as the p-type dopant. Growth for ten minutes provided a 100-nm-thick upper cladding layer 105 of p-type aluminum gallium nitride. The aluminum composition was 10%. Based on SIMS analysis, the concentration of the doped magnesium was determined to be $2 \times 10^{19}$ cm$^{-3}$. A 100-nm-thick p-type gallium nitride contact layer 106 doped with magnesium was deposited for 10 minutes at 1100° C. on the upper cladding layer 105. The carrier concentration of the contact layer 106 was $6 \times 10^{17}$ cm$^{-3}$. After completion of the formation of the contact layer 106, the wafer thus formed was cooled from 1100° C. to 950° C. with cooling rate of 20° C./min. From 950° C. to 800° C., the wafer was cooled at a cooling rate slightly less than 20° C./min and maintained at 800° C. for 20 minutes. The wafer was allowed to cool spontaneously via 650° C. down to around room temperature. Thus, the wafer stayed at temperature over 950° C. for 27.5 minutes.

The active layer was observed by the cross-sectional TEM method. The active layer had texture involving crystallets of gallium indium nitride. The crystallets were approximately 2 to 3 nm in diameter and substantially spherical in shape. Over and around the crystallets was a matrix of principally gallium nitride. Namely, the active layer of this example was recognized as being comprised of gallium indium nitride crystallets and a gallium nitride matrix. The above epitaxial wafer was provided with electrodes to form a LED. A forward voltage of 5 volts at forward current of 20 milliamperes were applied to the LED thus fabricated. The wavelength of the blue-light emission was 445 nm. After the mold of LED with epoxy resin, the emission power was measured and found to be 1.0 milliwatt. The FWHM of the emission spectrum was 30 nm.

EXAMPLE 2

First, a low-temperature buffer layer of undoped gallium nitride was grown on a sapphire substrate at 530° C. The thickness of the low-temperature buffer layer was about 7 nm. A lower cladding layer of silicon-doped n-type gallium nitride was grown on the low-temperature buffer layer at 1100° C. The carrier concentration was about $1 \times 10^{18}$ cm$^{-3}$ and the thickness of the layer was approximately 4 μm. Following the completion of the formation of the lower cladding layer, the temperature of the substrate was lowered from 1100° C. to the active layer formation temperature (T° C.) of 830° C. in about 10 minutes. After waiting until temperature was stabilized, growth of a silicon-doped gallium indium nitride active layer was started. The same source gases as in Example 1 were used to grow the active layer having an indium composition of 20%. For 2.5 minutes of growth, a 5-nm-thick active layer of $Ga_{0.80}In_{0.20}N$ was formed.

After completion of the growth of the n-type active layer, the temperature of the substrate was again elevated from 830° C. to 1100° C. at a rate of 90° C./min in 3 minutes. After a standby for 5 minutes until the temperature stabilized at 1100° C., an upper cladding layer of magnesium-doped gallium nitride was formed. Twenty minutes was consumed to grow an upper cladding layer with 200 nm thickness. The temperature was then reduced from 1100° C. to 950° C. within the space of 5 minutes, using a temperature reduction rate of 30° C./min. In this Example, growth process of the upper cladding layer at 1100° C. including the standby sequence is utilized substitutionally as the active layer heat treatment process. The wafer thus stayed for approximately 30 minutes at or above 950° C. This was followed by the secondary cooling process, in which the temperature was reduced from 950° C. to 650° C. at the rate of 10° C./min. The cooling process was done in an atmosphere of hydrogen, argon and ammonia gas supplied at an individual flow rate of 3 liters per minute. After completion of the secondary cooling process, the wafer was allowed to cool naturally down to around room temperature.

The wafer subjected to the above heat treatment was examined using a TEM analysis. Substantially spherical crystallets were observed in the gallium indium nitride active layer. Based on cross-sectional TEM photographic images, the size of the crystallets was found to range from 4 nm to a maximum of 13 nm in diameter. Crystallets having a diameter of approximately 7 to 8 nm were present in high frequency. The average diameter was about 10 nm. The crystallets were distributed more or less homogeneously in the active layer. The density of crystallets was about $8 \times 10^{16}$ cm$^{-3}$.

Figure 3:
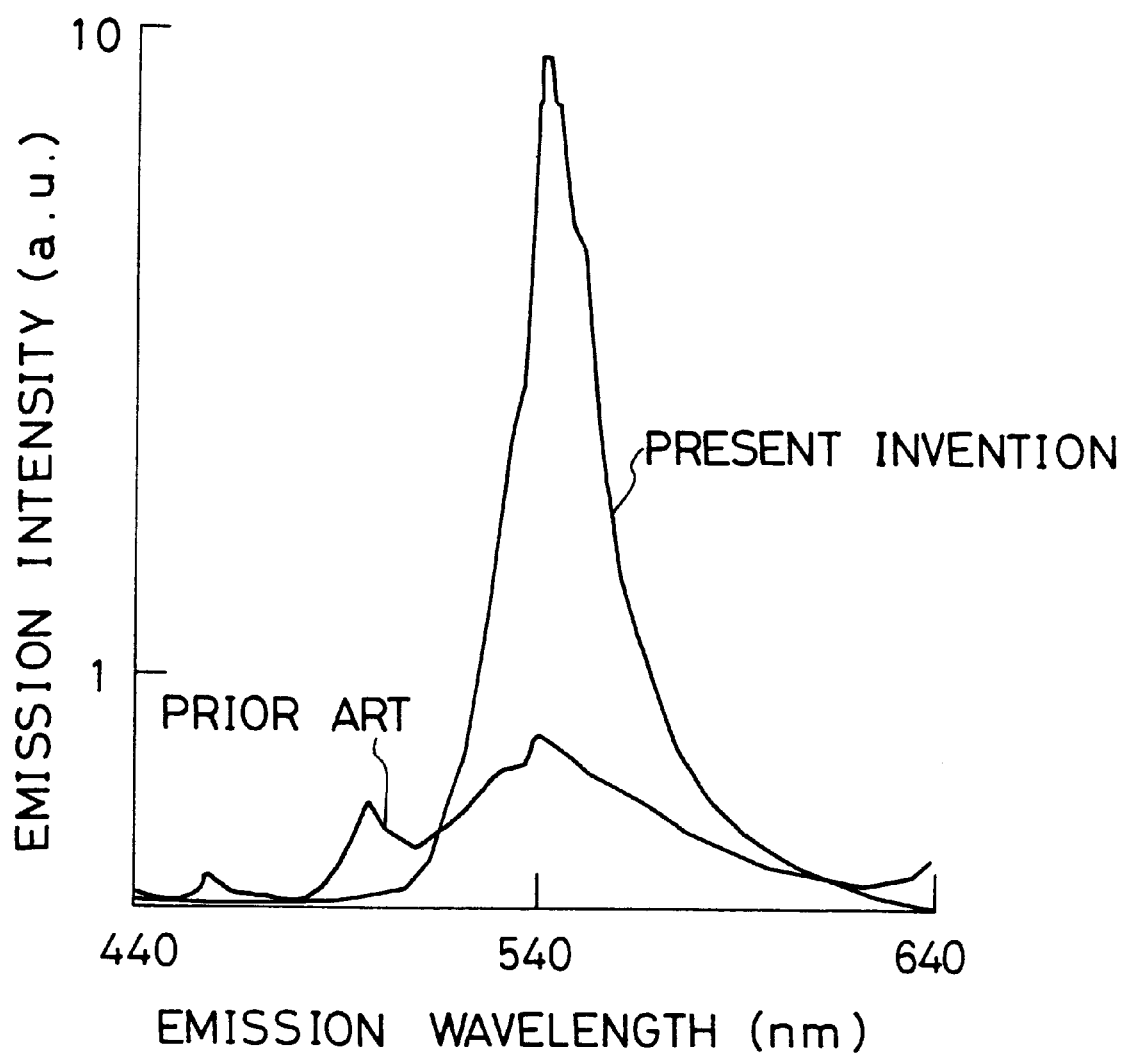
FIG. 3 shows emission spectra of light-emitting devices according to the invention and prior art.

A light-emitting device was formed in the same way as in Example 1, and the emission characteristics were evaluated. The wavelength of the emission was 542 nm. The FWHM was 15 nm, and emission power was 1.7 mW. FIG. 3 compares the emission spectrum of Example 2 to prior art. This reveals that the LED of the present invention exhibited high emission power and excellent emission monochromaticity.

EXAMPLE 3

A low-temperature buffer layer of undoped gallium nitride was grown on a sapphire substrate at 430° C. The thickness of the low-temperature buffer layer was about 7 nm. A lower cladding layer of silicon-doped n-type gallium nitride was grown on the low-temperature buffer layer. The carrier concentration was about $1 \times 10^{18}$ cm$^{-3}$ and the thickness of the layer was approximately 4 μm. Following the completion of the formation of the lower cladding layer, the temperature of the substrate was lowered from 1100° C. to the active layer formation temperature (T° C.) of 850° C. in about 10 minutes. After waiting for the temperature to stabilize for 15 minutes, growth of a silicon-doped aluminum gallium indium nitride $Al_{0.01}Ga_{0.87}In_{0.12}N$ active layer was initiated. Trimethyl aluminum as the aluminum source was supplied at a flow rate of 0.22 ml/min. Trimethyl gallium as the gallium source was supplied at a flow rate of 1.5 ml/min, and trimethyl indium as the indium source was supplied at a flow rate of 0.02 ml/min. Germanium and Zn were used as dopants. The Ge dopant source was germane ($GeH_4$) diluted with hydrogen gas to a concentration by volume of 10 ppm. The germane was supplied at a flow rate of 100 ml/min. As in Example 1, diethyl zinc was used as the source of the zinc dopant. The concentrations of Ge and Zn in the active layer were $7 \times 10^{17}$ cm$^{-3}$ and $9 \times 10^{17}$ cm$^{-3}$, respectively.

The substrate temperature was then elevated from 850° C. to 1050° C. at a rate of 50° C./min in 4 minutes. Then, a magnesium-doped upper cladding layer of $Al_{0.05}Ga_{0.95}N$ and a magnesium-doped contact layer of GaN were formed. The total time required to grow the upper cladding layer and the contact layer was 30 minutes. In this Example, the heat treatment was done as a part of the growth process utilized to form the upper cladding layer and the contact layer.

Next came the substrate cooling procedure. In the primary cooling process, the substrate temperature was lowered for 5 minutes from 1050° C. (=T° C.) to 950° C. at a rate of 20° C./min in a mixed-gas atmosphere of ammonia and argon. In a first stage of the secondary cooling process, the temperature was lowered to 850° C. at a rate of 10° C./min. This was followed by a second step of the secondary cooling process, in which the temperature was reduced from 850° C. to 800° C., at a rate of 2° C./min. The secondary cooling process was then completed by a third step, in which the temperature was reduced from 800° C. to 650° C. at a rate of 5° C./min in an argon atmosphere. From 650° C., the substrate was allowed to cool spontaneously to room temperature, which took about 60 minutes. FIG. 4 shows the time-sequential heat diagram for the cooling process in Example 3.

A cross-sectional TEM examination of the epitaxial wafer thus obtained showed that most of the crystallets in the active layer were roughly spherical, with diameters concentrated in the range of 7 to 8 nm. The average diameter was approximately 8 nm. Crystallet density was $2 \times 10^{17}$ cm$^3$. A LED was formed using the same procedure followed in Example 1, and the characteristics were evaluated. Application of 5 V at a forward current of 20 mA produced emission of blue light having a wavelength of 434 nm. The LED chip sealed in epoxy resin had an emission intensity of 1.2 mW. The blue LED obtained exhibited high emission power and, good monochromaticity with FWHM of 7 nm.

COMPARATIVE EXAMPLE

A conventional green LED was fabricated having a gallium indium nitride mixed-crystal active layer with a high indium mixing ratio of 0.45 (Jpn. J. Appl. Phys., 34 (1995), pp L1332–L1335). Except for the active layer, the layer structure for this LED was formed by following the same procedure described in the Example 1. Because of the higher indium composition of 45%, the active layer was grown at a temperature of 550° C. compared to the 830° C. used in Example 1. The 5 nm thick active layer required growth period for 5 minutes. The indium composition of the active layer was down to 20% in average because of condensation of indium into droplets. The layered structure obtained in accordance with this Comparative Example was used to fabricate a LED as described in Example 1. A forward voltage of 5 V at a current of 20 mA was applied to the device. Emission of green light had a wavelength ranging from 510 to 530 nm with FWHM of 40 nm. An output power was 0.3 mW.

What is claimed is:

1. A method of forming an epitaxial wafer for a light-emitting device by sequentially growing a lower cladding layer of $Al_\alpha Ga_\beta N$ ($0 \leq \alpha, \beta \leq 1, \alpha+\beta=1$), an AlGaInN active layer, and an upper cladding layer of $Al_\alpha Ga_\beta N$ ($0 \leq \alpha, \beta \leq 1, \alpha+\beta=1$) on a single-crystal substrate, wherein the AlGaInN active layer is formed by epitaxially growing an active layer of $Al_a Ga_b In_c N$ (wherein $0 \leq a, b, c \leq 1, a+b+c=1$) on the lower cladding layer at a temperature of from 650° C. to 950° C., elevating the temperature of the active layer at a rate of not less than 30° C./min until reaching a temperature range of from more than 950° C. to not more than 1200° C., and when prescribed temperature is reached, primarily cooling the resultant layer to 950° C. within 60 minutes at not less than 20° C./min, and secondarily cooling the resultant layer from 950° C. to 650° C. at less than 20° C./min.

* * * * *